United States Patent [19]
Jenner et al.

[11] Patent Number: 5,997,660
[45] Date of Patent: Dec. 7, 1999

[54] MAGNETIC MATERIALS

[75] Inventors: Alan Gordan Ian Jenner, Hessle; Kamlesh Prajapati, Bradford, both of United Kingdom

[73] Assignee: University of Hull, Hull, United Kingdom

[21] Appl. No.: 09/091,637

[22] PCT Filed: Dec. 17, 1996

[86] PCT No.: PCT/GB96/03118

§ 371 Date: Oct. 5, 1998

§ 102(e) Date: Oct. 5, 1998

[87] PCT Pub. No.: WO97/23913

PCT Pub. Date: Jul. 3, 1997

[30] Foreign Application Priority Data

Dec. 21, 1995 [GB] United Kingdom .................. 9526177

[51] Int. Cl.[6] ...................................................... H01F 1/00
[52] U.S. Cl. ...................................... 148/301; 252/62.55
[58] Field of Search ......................... 148/301; 252/62.55

[56] References Cited

U.S. PATENT DOCUMENTS 4,152,178  5/1979  Malekzadeh et al. .................. 148/103
4,308,474  12/1981  Savage et al. .............................. 310/26

FOREIGN PATENT DOCUMENTS

0509628 A1  10/1992  European Pat. Off. .

OTHER PUBLICATIONS

Notsu, Y et al, High Pressure Synthesis and Magnetostrictive Measurement of Laves Phase Pr1–xRxFe2 (R=Ce, Nd), Japanese Journal of Applied Physics, Supplements, vol. 32, No. 3, pp. 327–328, 1993.

Kendall, D. et al, "Magnetisation Processes and Temperature Dependence of the Magnetomechanical Properties of Tb0.27Dy0.73Fe2" Proceedings of the International Magnetics Conference, (Intermag), Brighton, p. CQ–16 complete, Institute of Electrical And El Apr. 1990.

Al–Jiboory, M et al, "Magnetic and Microstructural Defects in Terfenol–D", Journal of Applied Physics, vol. 73, No. 10, Pt. IIB, pp. 6168–6170, May 1993.

Westwood, P et al, "Microstructural Characterisation of Ternary Rare Earth–Iron Alloys", IEEE Transactions of Magnetics, vol. 24, No. 2, pp. 1873–1875, Mar. 1988.

*Primary Examiner*—Ngoclan Mai
*Attorney, Agent, or Firm*—Leydig, Voit & Mayer, Ltd.

[57] ABSTRACT

A method of manufacturing a magnetic material exhibiting magnetostrictive properties in which the Curie Temperature of the material is maintained by the addition of cerium. The cerium may be added by a substitution mechanism.

1 Claim, 1 Drawing Sheet

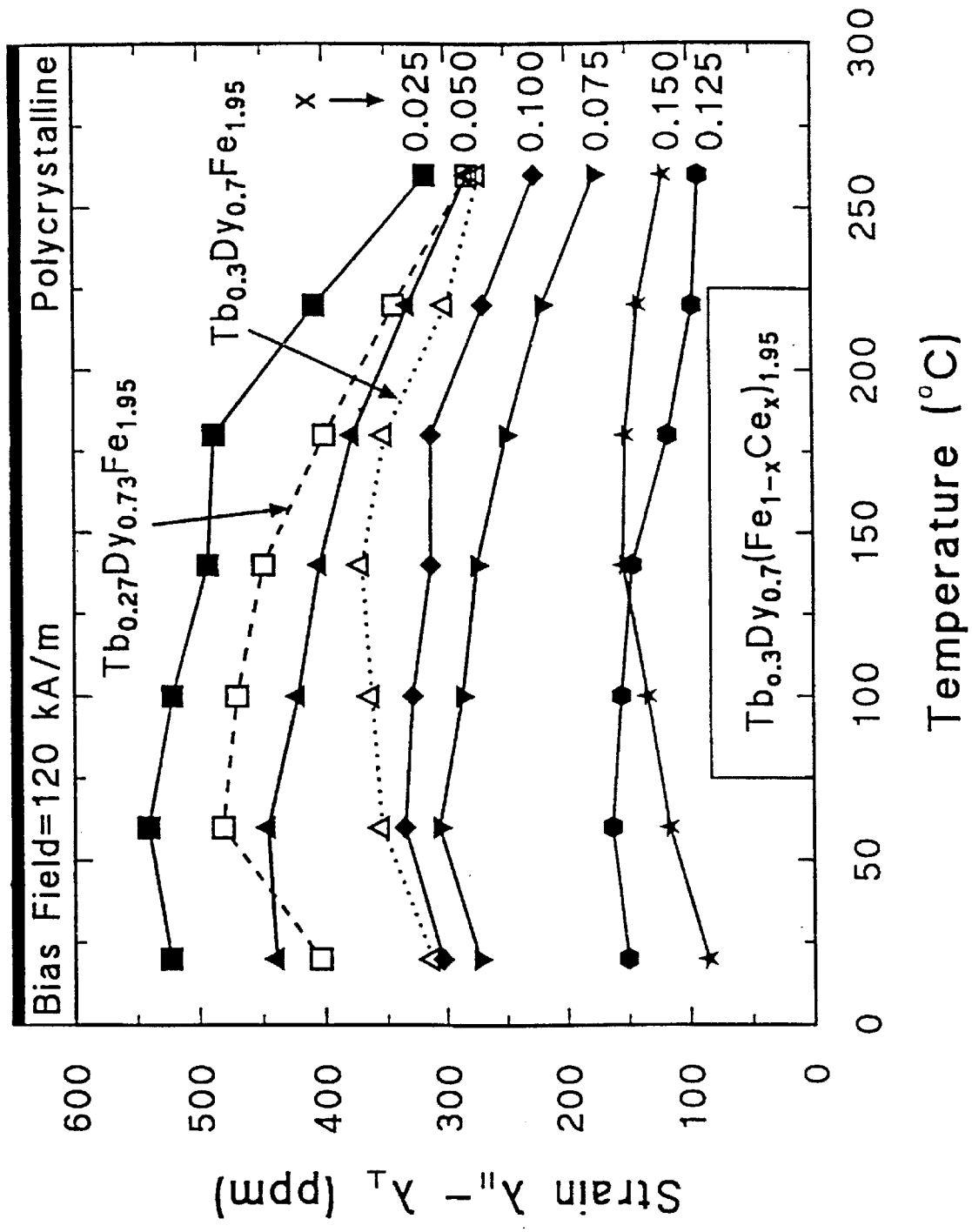

MAGNETIC MATERIALS

The invention relates generally to magnetic materials, and in particular to magnetic materials exhibiting magnetostrictive properties and to methods of manufacturing such materials.

A known form of such a magnetic material is a magnetic iron-based material comprising in addition to iron a combination of rare-earth elements in varying quantities. The iron content of the material is responsible for the higher Curie Temperature of the material. Magnetostriction comes from the rare earths. Rare earths are ferromagnetic at very low temperatures i.e. 4K.

According to a first aspect of the invention there is provided a method of manufacturing a magnetic material comprising adding to a rare earth based iron intermetallic megnetic material, exhibiting magnetostrictive properties, an amount of cerium sufficient to maintain the Curie Temperature.

An enhanced dominant exchange interaction mechanism raises the Curie Temperature of the material, extending operating temperature ranges of devices manufactured from the material.

The magnetostrictive material may be a rare earth based iron intermetallic material.

Additionally the magnetostrictive material may be crystalline or amorphous.

The cerium may be added by mechanisms other than substitution.

According to a second aspect of the invention, there is provided a magnetic material comprising a combination of rare earth elements and iron with an amount of cerium sufficient to cause an enhancement of the dominant exchange interaction.

The following is a more detailed description of a preferred embodiment of the material, by way of example only, with reference to the accompanying drawing which is a graph in which the magnetically induced strain in various magnetostrictive materials is plotted against temperature.

In a first embodiment of the invention the material is a rare earth based iron magnetostrictive intermetallic material, such as Terfenol. Prior to addition of the cerium, the Terfenol material has a chemical formula

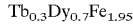
$Tb_{0.3}Dy_{0.7}Fe_{1.95}$

An iron-cerium compound with the formula $(Fe_{1-x}Ce_x)$ is prepared and substituted for the Fe in the above formula giving

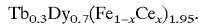
$Tb_{0.3}Dy_{0.7}(Fe_{1-x}Ce_x)_{1.95}$.

The cerium is added in amounts of less than 5 atomic per cent.

Referring to the Figure, there is plotted the magnetically induced strain in materials of the kind described above, over a range of temperatures from about 20° C. to about 270° C. The magnetic strain is induced by a bias field of 120 A/m applied across the material. The strain is measured by strain gauges in units of ppm (parts per million). $\lambda_{11}$ and $\lambda_1$ denote the strain measured parallel and perpendicular to the magnetic field direction. Six materials were tested, al 1 of the general formula:

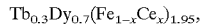
$Tb_{0.3}Dy_{0.7}(Fe_{1-x}Ce_x)_{1.95}$,

With x=0.025, 0.050, 0.075, 0.100, 0.125 and 0.150.

For comparison purposes two materials not containing cerium were also tested—$Tb_{0.27}Dy_{0.73}Fe_{1.95}$ and $Tb_{0.3}Dy_{0.7}Fe_{1.95}$.

It will be seen that when x=0.025 and 0.050 the materials had an increased magnetically induced strain over most of the tested temperature range. This was particularly true for the material x=0.025.

The long range magnetic order within a material is broken down at the Curie Temperature by thermal energy. The stronger the exchange interaction is between the magnetic moments, the more thermal energy is required to break up the magnetic order. Essentially, this means a higher temperature is required. Above their Curie temperature materials become paramagnetic i.e. non-magnetic. Magnetostrictive properties arise from the dependence on the rate of change of the magnetic properties present within the material. If there is no magnetisation there is no magnetostriction.

The addition of the small amounts of cerium maintains the magnetically induced strain in the material significantly over the values for the initial Terfenol compound for temperatures up to 250° C. This is surprising, because conventional theory predicts that replacement of the iron with rare earth ions should cause a fall in the Curie Temperature and hence a deterioration in the magneto-strictive properties at higher temperatures.

We claim:

1. A magnetic material where the material has a chemical formula

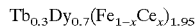
$Tb_{0.3}Dy_{0.7}(Fe_{1-x}Ce_x)_{1.95}$ where $0<X<0.05$.

* * * * *